US012712154B2

(12) United States Patent
Lee et al.

(10) Patent No.: US 12,712,154 B2
(45) Date of Patent: Aug. 18, 2026

(54) PLASMA APPARATUS

(71) Applicants: SAMSUNG ELECTRONICS CO., LTD., Suwon-si (KR); POSTECH Research and Business Development Foundation, Pohang-si (KR)

(72) Inventors: Jimo Lee, Suwon-si (KR); Hyung Gu Kang, Pohang-si (KR); GunSu Yun, Pohang-si (KR); Kyung-Sun Kim, Suwon-si (KR); Donghyeon Na, Suwon-si (KR); Seungbo Shim, Suwon-si (KR); Seokyong Jeong, Suwon-si (KR)

(73) Assignees: SAMSUNG ELECTRONICS CO., LTD., Suwon-si (KR); POSTECH RESEARCH AND BUSINESS DEVELOPMENT FOUNDATION, Pohang-si (KR)

( * ) Notice: Subject to any disclaimer, the term of this patent is extended or adjusted under 35 U.S.C. 154(b) by 38 days.

(21) Appl. No.: 19/019,823

(22) Filed: Jan. 14, 2025

(65) Prior Publication Data

US 2026/0038768 A1 Feb. 5, 2026

(30) Foreign Application Priority Data

Jul. 30, 2024 (KR) ........................ 10-2024-0101291

(51) Int. Cl.
*H01J 37/32* (2006.01)

(52) U.S. Cl.
CPC .. *H01J 37/32183* (2013.01); *H01J 37/32128* (2013.01); *H01J 37/32146* (2013.01); *H01J 37/32926* (2013.01); *H01J 2237/334* (2013.01)

(58) Field of Classification Search
CPC ................ H01J 37/32; H01J 37/32128; H01J 37/32183; H01J 37/32082; H01J 37/32532; H01J 37/32146; H01J 37/32165; H01J 37/32174; H01J 37/32926; H01J 2237/334
See application file for complete search history.

(56) References Cited

U.S. PATENT DOCUMENTS 5,397,961 A 3/1995 Ayers et al.
7,871,830 B2 1/2011 Johal et al.
9,478,397 B2 * 10/2016 Blackburn ........ H01J 37/32183
9,659,757 B2 5/2017 Kuthi et al.
(Continued)

*Primary Examiner* — Thai Pham
(74) *Attorney, Agent, or Firm* — MORGAN, LEWIS & BOCKIUS LLP

(57) ABSTRACT

A plasma apparatus includes: a chamber; a first electrode and a second electrode disposed in the chamber; an RF power generator configured to apply non-sinusoidal wave power to the first electrode, wherein plasma is generated in the chamber in response to the non-sinusoidal wave power being applied to the first electrode; a measuring device configured to measure a voltage data over time and a current data over time of the non-sinusoidal wave power that is applied from the RF power generator; and a controller configured to receive the voltage data over time and the current data over time from the measuring device, and to calculate an extended impedance associated with the plasma based on the voltage data over time and the current data over time, wherein the extended impedance has a single complex value representing the non-sinusoidal wave power associated with a plurality of frequencies.

20 Claims, 14 Drawing Sheets

(56) References Cited

U.S. PATENT DOCUMENTS

| | | | | |
|---|---|---|---|---|
| 9,831,064 | B2 | 11/2017 | Konno et al. | |
| 10,115,567 | B2 | 10/2018 | Hirano et al. | |
| 10,854,427 | B2 | 12/2020 | Kawasaki et al. | |
| 2003/0097984 | A1* | 5/2003 | Nakano | H01J 37/32082 118/712 |
| 2009/0242132 | A1* | 10/2009 | Sato | H10P 72/0421 156/345.43 |
| 2019/0108976 | A1* | 4/2019 | Van Zyl | H01J 37/32146 |
| 2020/0218774 | A1* | 7/2020 | Howald | G06F 30/367 |
| 2021/0090859 | A1* | 3/2021 | Bhutta | H01J 37/32183 |
| 2023/0207294 | A1* | 6/2023 | Jin | H01J 37/32155 156/345.28 |
| 2023/0377842 | A1 | 11/2023 | Bae et al. | |
| 2024/0079212 | A1* | 3/2024 | Guo | H01J 37/32183 |
| 2025/0246405 | A1* | 7/2025 | Tai | H01J 37/32174 |

* cited by examiner

PLASMA APPARATUS

CROSS-REFERENCE TO RELATED APPLICATION

This application claims priority under 35 U.S.C. § 119 to Korean Patent Application No. 10-2024-0101291, filed in the Korean Intellectual Property Office on Jul. 30, 2024, the disclosure of which is incorporated by reference herein in its entirety.

TECHNICAL FIELD

The present inventive concept relates to a plasma apparatus.

DISCUSSION OF THE RELATED ART

Generally, manufacturing a semiconductor device or a display device involves various processes such as etching, ashing, ion implantation, thin film deposition, cleaning, etc. Plasma may be used in these various processes of manufacturing a semiconductor device.

When performing an etching process on semiconductor substrates, etc. by using a plasma apparatus, a non-sinusoidal wave may be applied to create plasma for reasons such as aspect ratio improvement, etc. The non-sinusoidal wave has various frequencies, and the impedance of the plasma that is generated by the non-sinusoidal wave power may vary according to the frequency of the applied power.

SUMMARY

According to embodiments of the present inventive concept, a plasma apparatus includes: a chamber; a first electrode and a second electrode disposed in the chamber, wherein the second electrode is spaced apart from the first electrode; an RF power generator configured to apply non-sinusoidal wave power to the first electrode, wherein plasma is generated in the chamber in response to the non-sinusoidal wave power being applied to the first electrode; a measuring device configured to measure a voltage data over time and a current data over time of the non-sinusoidal wave power that is applied from the RF power generator; and a controller configured to receive the voltage data over time and the current data over time from the measuring device, and to calculate an extended impedance associated with the plasma based on the voltage data over time and the current data over time, wherein the extended impedance has a single complex value representing the non-sinusoidal wave power associated with a plurality of frequencies.

According to embodiments of the present inventive concept, a plasma apparatus includes: a chamber; a first electrode a second electrode disposed in the chamber, the second electrode facing the first electrode; an RF power generator configured to apply non-sinusoidal wave power to the first electrode, wherein plasma is generated in the chamber in response to the non-sinusoidal wave power being applied to the first electrode; a measuring device disposed outside the chamber and configured to measure a voltage data over time and a current data over time of non-sinusoidal wave power that is applied from the RF power generator; and a controller configured to receive the voltage data over time and the current data over time from the measuring device, and calculate an extended impedance associated with the plasma based on the voltage data over time and the current data over time, wherein impedance calculated in a frequency domain of the non-sinusoidal wave power varies according to frequency, and the extended impedance has a single complex number value independent of the frequency, and is a weighted average of the impedance calculated in the frequency domain of the non-sinusoidal wave power with respect to a square of a current component.

According to embodiments of the present inventive concept, a plasma apparatus includes: a vacuum chamber provided with an upper electrode, to which power is applied, and a grounded lower electrode; an RF power generator configured to apply pulse power to the upper electrode, wherein plasma is generated between the upper electrode and the grounded lower electrode in response to the pulse power being applied to the upper electrode; a measuring device disposed outside the vacuum chamber and configured to measure voltage data over time, current data over time, and a pulse period value of the pulse power that is applied from the RF power generator; a matching circuit connected between the RF power generator and the measuring device to adjust impedance for transferring the pulse power; and a controller configured to: receive the voltage data over time, the current data over time, and the pulse period value, calculate an extended impedance associated with the plasma based on the voltage data over time, and the current data over time, and control the matching circuit based on the extended impedance, wherein an impedance calculated in a frequency domain of the pulse power varies with frequency, and the extended impedance has a single complex value that is independent of the frequency and represents the pulse power associated with a plurality of frequencies.

DETAILED DESCRIPTION OF THE EMBODIMENTS

Hereinafter, a plasma apparatus according to embodiments of the present inventive concept will be described in detail with reference to the drawings.

Embodiments of the present inventive concept relate to a plasma apparatus designed for use in, for example, semiconductor and display device manufacturing processes, such as etching, ashing, ion implantation, and thin-film deposition. Embodiments of the present inventive concept may calculate an extended impedance of the plasma that is generated in response to non-sinusoidal wave power, which typically includes multiple frequencies. This extended impedance may be a single value that encapsulates the frequency-dependent characteristics of the plasma, enabling increased process control.

According to embodiments of the present inventive concept, the apparatus includes a chamber with a first and second electrode, an RF power generator for applying non-sinusoidal wave power, a measuring device for obtaining voltage and current data over time, and a controller that calculates the extended impedance based on these measurements. Unlike traditional methods that calculate impedance for individual frequencies, the extended impedance may provide a unified representation that increases accuracy. This is achieved by using a weighted averaging approach across the frequency spectrum, accounting for the square of the current component.

The calculated extended impedance may provide real-time adjustments to power delivery, ensuring efficient energy transfer by minimizing reflected power. The apparatus may monitor changes in the plasma state or characteristics, such as electron density. Furthermore, the extended impedance supports improved impedance matching between the RF generator and the chamber, reducing power loss and increasing process efficiency.

By focusing on extended impedance, embodiments of the present inventive concept may provide increased power efficiency, plasma process control, and overall system reliability.

Figure 1:
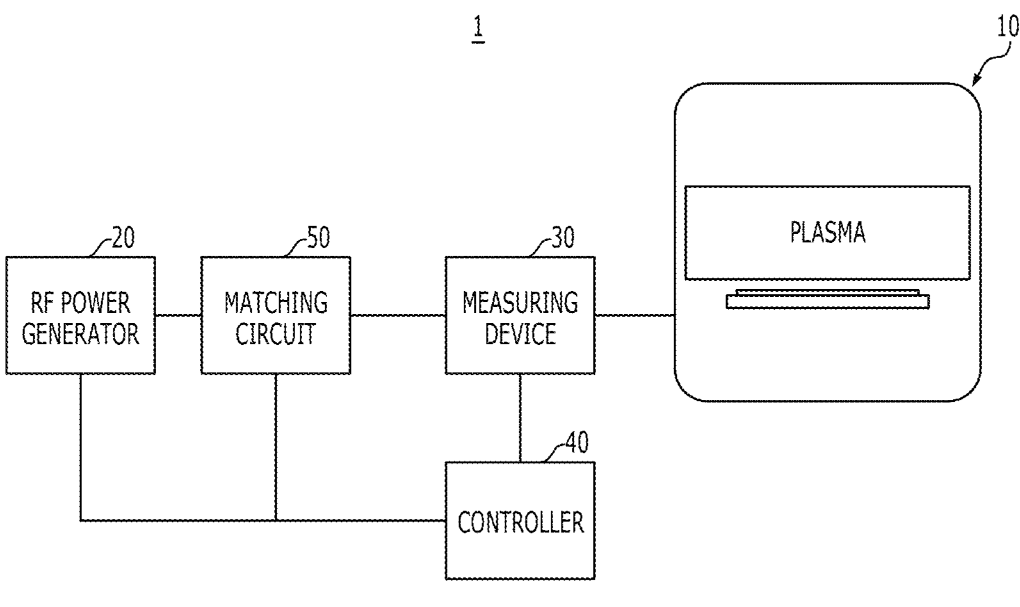
FIG. 1 is a conceptual diagram schematically illustrating a plasma apparatus according to embodiments of the present inventive concept.
Figure 2:
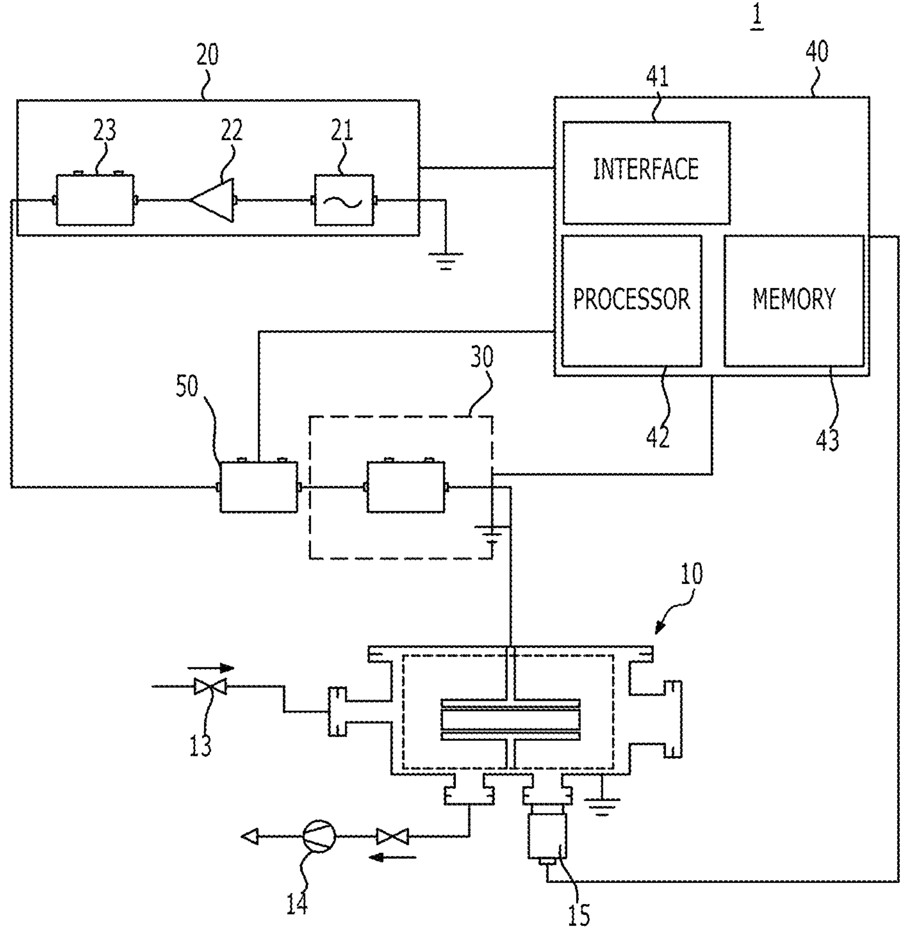
FIG. 2 is a diagram illustrating a partial configuration of a plasma apparatus according to embodiments of the present inventive concept.
Figure 3:
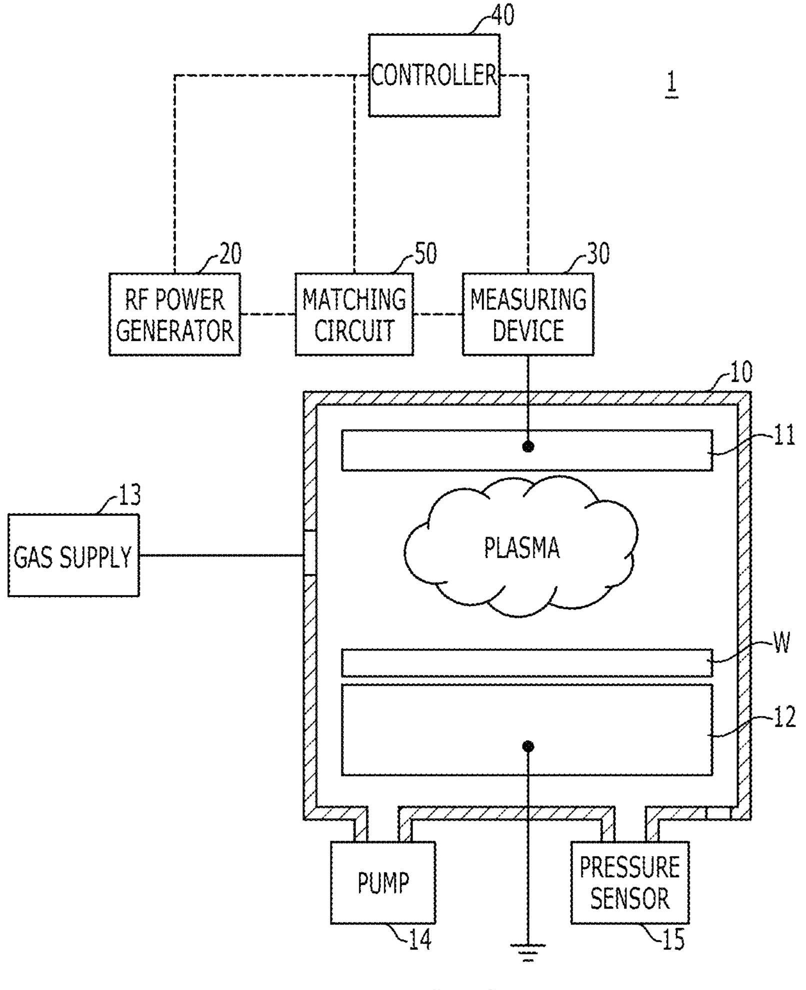
FIG. 3 is a diagram illustrating a partial configuration of a plasma apparatus according to embodiments of the present inventive concept.

FIG. 1 is a conceptual diagram schematically illustrating a plasma apparatus 1 according to embodiments of the present inventive concept. FIG. 2 is a view illustrating a partial configuration of the plasma apparatus 1 according to embodiments of the present inventive concept. FIG. 3 is a view illustrating a partial configuration of the plasma apparatus 1 according to embodiments of the present inventive concept.

Referring to FIGS. 1 to 3, the plasma apparatus 1 according to embodiments of the present inventive concept may refer to an apparatus that processes a semiconductor wafer substrate by using non-sinusoidal wave plasma. The plasma apparatus 1 may be an inductively coupled plasma apparatus that performs wafer processing, for example, plasma etching using inductively coupled plasma (ICP). In addition, the plasma apparatus 1 may be a capacitively coupled plasma apparatus using capacitively coupled plasma (CCP).

The plasma apparatus 1 according to embodiments of the present inventive concept may include a chamber 10, an RF power supply 20, a measuring device 30, a controller 40, and a matching circuit 50.

The chamber 10 may include an inner space for performing a plasma process. The plasma process may include etching, ashing, ion implantation, thin film deposition, cleaning, etc., but the present inventive concept is not limited thereto. The chamber 10 may be a vacuum chamber, or a load lock chamber switchable between atmospheric and vacuum states. The chamber 10 may include a metal such as aluminum or stainless steel, but the present inventive concept is not limited thereto. A susceptor (e.g., an electrostatic chuck) may be positioned in the chamber 10, and a substrate W for plasma processing may be mounted on the susceptor.

For example, the substrate W may refer to a semiconductor substrate on which a semiconductor process is performed, or to a wafer formed of a semiconductor material such as silicon, etc. Semiconductor devices, wiring patterns connected to the semiconductor devices, insulating layers covering the semiconductor devices and the wiring patterns may be formed on the substrate W, and a plurality of semiconductor chips may be produced from the substrate W.

A first electrode 11 and a second electrode 12 may be disposed inside the chamber 10. The first electrode 11 and the second electrode 12 may be spaced apart from each other. For example, the first electrode 11 and the second electrode 12 may face each other. In embodiments of the present inventive concept, the first electrode 11 may be an upper electrode, and the second electrode 12 may be a lower electrode, but the present inventive concept is not limited thereto. For example, the first electrode 11 may be disposed above an inner space of the chamber, and the second electrode 12 may be disposed below the inner space of the chamber.

Hereinafter, it will be described that the first electrode 11 is the upper electrode and the second electrode 12 is the lower electrode. Plasma may be formed between the upper electrode 11 and the lower electrode 12. In the plasma apparatus 1 according to embodiments of the present inventive concept, a non-sinusoidal wave power may be applied to the upper electrode 11. The lower electrode 12 may be grounded. In addition, it is to be noted that embodiments of the present inventive concept are not limited to the above, and a bias power source may be connected to the lower electrode 12. In embodiments of the present inventive concept, the lower electrode 12 may serve as an electrostatic chuck. For example, the substrate W may be fixed to an upper side of the lower electrode 12.

An RF power generator 20 may be connected to the first electrode 11. The RF power generator 20 may apply RF power to the first electrode 11. The RF power applied to the first electrode 11 may ignite plasma. The RF power supply 20 may generate plasma in the chamber 10 by applying non-sinusoidal wave power to the first electrode 11. The RF power supply 20 may apply the non-sinusoidal wave power to change the process gas supplied by a gas supply 13, which is to be described below, into a plasma state.

The plasma apparatus 1 may include the gas supply 13 that supplies the process gas into the chamber 10. The gas supply 13 may supply the process gas, which is for performing the plasma process, to the inner space of the chamber 10. For example, the process gas may include Ar, $O_2$, $Cl_2$, $SF_6$, etc. In one example, the gas supply 13 may be connected to the upper electrode 11 and may include a shower head to deliver the process gas.

The supplied process gas may be changed into a plasma state by the power supplied from the RF power generator 20. The RF power generator 20 may be connected to the first electrode 11 and may supply non-sinusoidal wave power for plasma generation to the first electrode 11. For example, the voltage output from the RF power generator 20 may be supplied to the first electrode 11 through the matching circuit 50.

The plasma apparatus 1 may include a pump 14 and a pressure sensor 15 to maintain the inner space of the chamber 10 in the vacuum state. The chamber 10 may maintain the inner space in a sealed state at a predetermined pressure and temperature in the plasma processing process, for example, etching process. For example, the pump 14 may exhaust the gas of the inner space of the chamber 10 so as to maintain the internal pressure of the chamber 10 at a set value. The pressure inside the chamber 10 may be measured by the pressure sensor 15, and the controller 40 may receive the measured pressure data from the pressure sensor 15. The measured pressure data may be displayed on a user interface 41.

The RF power generator 20 may include a signal generator 21, an RF amplifier 22, and a coupler 23. The RF power supply 20 may apply non-sinusoidal wave power to the first electrode 11. For example, the non-sinusoidal wave power may be pulse power.

The signal generator 21 may generate RF signals. The signal generator 21 may be operated in a continuous wave mode (CW) or a pulse mode (Pulse). The signal generator 21 may generate and output RF power having a frequency in the range of several MHz to several tens of MHz, but the present inventive concept is not limited thereto. In addition, the RF power supply 20 may generate and output RF power of tens to thousands of watts (W), but the present inventive concept is not limited thereto.

The RF amplifier 22 may include a plurality of elements switched according to an input RF signal to amplify and output an RF frequency. For example, the plurality of elements may include transistors, switching diodes, capacitors, inductors, PIN diodes, and integrated circuit modules.

The coupler 23 may measure a voltage of the RF power that is generated by the RF amplifier 22 and a voltage of reflected power that is reflected from the chamber 10. The coupler 23 may be a directional coupler that is coupled to an RF detector.

The measuring device 30 may measure the non-sinusoidal wave power applied from the RF power generator 20. For example, the measuring device 30 may measure voltage data over time and current data over time of the non-sinusoidal wave power that is applied from the RF power generator 20. For example, the measuring device 30 may be a voltage-current (VI) probe. The VI probe may be connected in the form of a coaxial line. The VI probe may immediately obtain the voltage data and the current data of the non-sinusoidal wave power.

The measuring device 30 may be disposed outside the chamber 10. The measuring device 30 may be disposed outside the chamber 10 and might not affect the state of the plasma. If the measuring device is disposed inside the chamber 10, that is, if it is an invasive probe, plasma perturbation may be caused. The perturbation of plasma may impair the uniformity of the process, so it is desirable to prevent perturbation. In embodiments of the present inventive concept, the plasma apparatus 1 includes the measuring device 30 disposed outside the chamber 10 so that the plasma inside the chamber 10 may be monitored without affecting the process. The measuring device 30 may be connected between the matching circuit 50 and the first electrode 11. The measuring device 30 may measure the reflected power that is reflected from the first electrode 11 and transmit the measured power to the matching circuit 50.

The matching circuit 50 may adjust an internal impedance to maximize transfer of the non-sinusoidal wave power that is output from the RF power generator 20. Through the internal impedance adjustment, the matching circuit 50 may minimize the reflected power from the chamber 10. To minimize the reflected power, the matching circuit 50 may match the impedance of the chamber 10 and the impedance of the RF power generator 20 equally. In embodiments of the present inventive concept, the reflected power may be minimized when the impedance of the chamber 10 and the impedance of the RF power generator 20 match at 5052. Since the characteristics of the plasma may change as the plasma process proceeds, the matching circuit 50 may continuously perform matching even during the plasma process.

For example, the matching circuit 50 may include a first variable capacitor used for rough control, a second variable capacitor used for fine control, an inductor to remove a DC component from a high frequency power output to the second variable capacitor, and a resistor connected to the inductor to detect a DC bias voltage. The matching circuit 50 may measure the reflected power from the chamber 10 to control the RF power generator 20 or adjust the internal impedance.

The controller 40 may calculate an extended impedance associated with the plasma. The controller 40 may receive voltage data over time and current data over time from the measuring device 30 to calculate the extended impedance. The controller 40 may calculate the extended impedance associated with the plasma based on the voltage data over time and the current data over time.

The controller 40 may include a user interface 41, a processor 42, and a memory 43.

The user interface 41 may receive a control command from a user and display operation information of the plasma apparatus 1. The user interface 41 may display data on the power that is applied from the RF power generator 20. For example, the user interface 41 may visually represent the voltage data and current data of the non-sinusoidal wave power over time. The user interface 41 may receive a command for controlling the components of the plasma apparatus 1. For example, the user may input, through the user interface 41, commands to turn on and off the RF power generator 20, adjust the pressure inside chamber 10, etc. In addition, the user may input, through the user interface 41, the pulse period value, pulse width value, etc. of the pulse power generated by the RF power generator 20. The user interface 41 may receive an input through a button, a touch panel, a switch, etc., and output information through a display, etc. However, embodiments of the present inventive concept are not limited thereto.

The memory 43 may store a program and various data for executing the operations of the controller 40. The memory 43 may include at least one of, for example, a volatile memory such as a static random access memory (SRAM), a dynamic random access memory (DRAM), etc., and a nonvolatile memory such as a flash memory, a read only memory (ROM), an erasable programmable read only memory (EPROM), an electrically erasable programmable read only memory (EPROM), etc.

The nonvolatile memory may operate as an auxiliary memory of the volatile memory, and may maintain stored data even if power of the plasma etching apparatus is cut off. For example, the non-volatile memory may store control programs and control data for controlling the operation of the plasma etching apparatus or the operation of the gas cooling device.

Unlike nonvolatile memory, the volatile memory may lose stored data if power of the plasma etching apparatus is cut off. The volatile memory may load a control program and control data from the nonvolatile memory and temporarily store the control program and control data, temporarily store an input setting value or control command, or temporarily store a control signal, etc. output from the processor 42.

The processor 42 may process data or output a control signal according to the program stored in the memory 43. For example, the processor 42 may perform calculations using an algorithm for a method for calculating an extended impedance, which is stored in the memory 43.

The processor 42 and the memory 43 may be provided in a single configuration or may be provided in a plurality of configurations according to their capacities. In addition, the processor 42 and the memory 43 may be physically separated or may be provided as a single chip.

Hereinafter, a method for calculating the extended impedance based on the voltage data and current data over time of the non-sinusoidal wave power that is received from the measuring device 30 by the controller 40 will be described.

Figure 4:
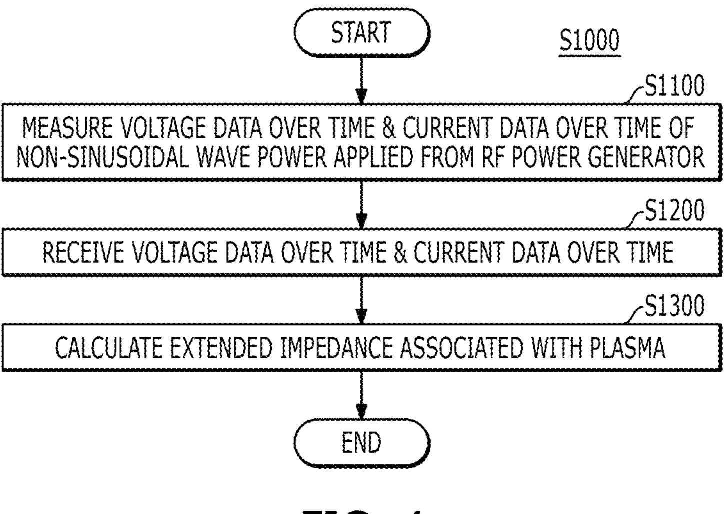
FIG. 4 is a flowchart illustrating a method of calculating the extended impedance according to embodiments of the present inventive concept.
Figure 5:
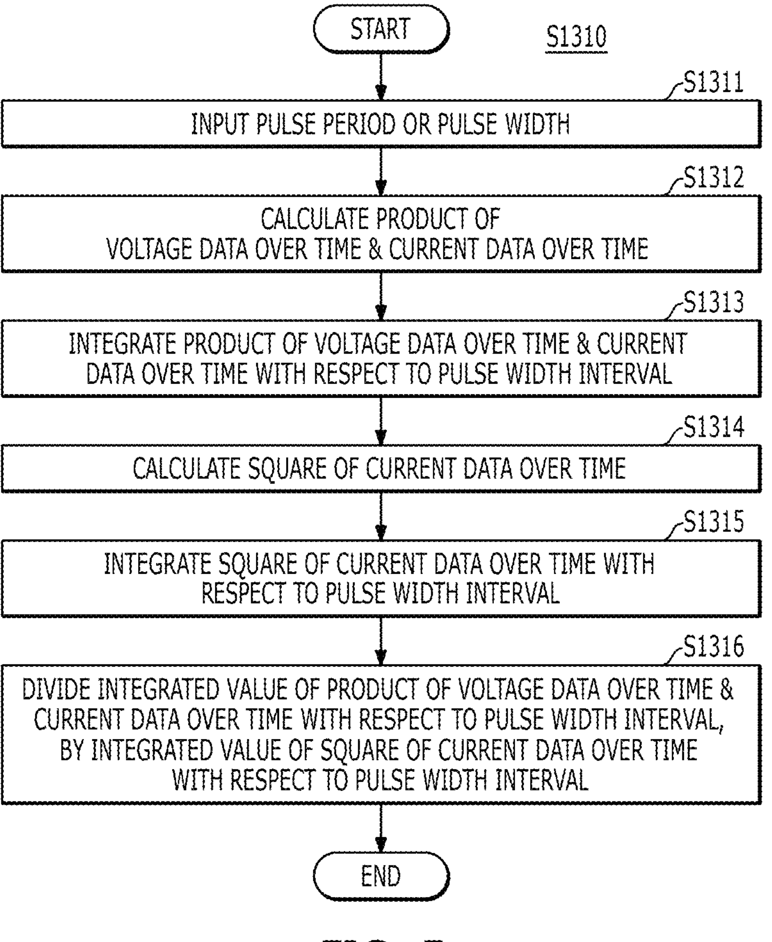
FIGS. 5 and 6 are flowcharts illustrating a method of calculating a real part and an imaginary part of the extended impedance, respectively.
Figure 6:
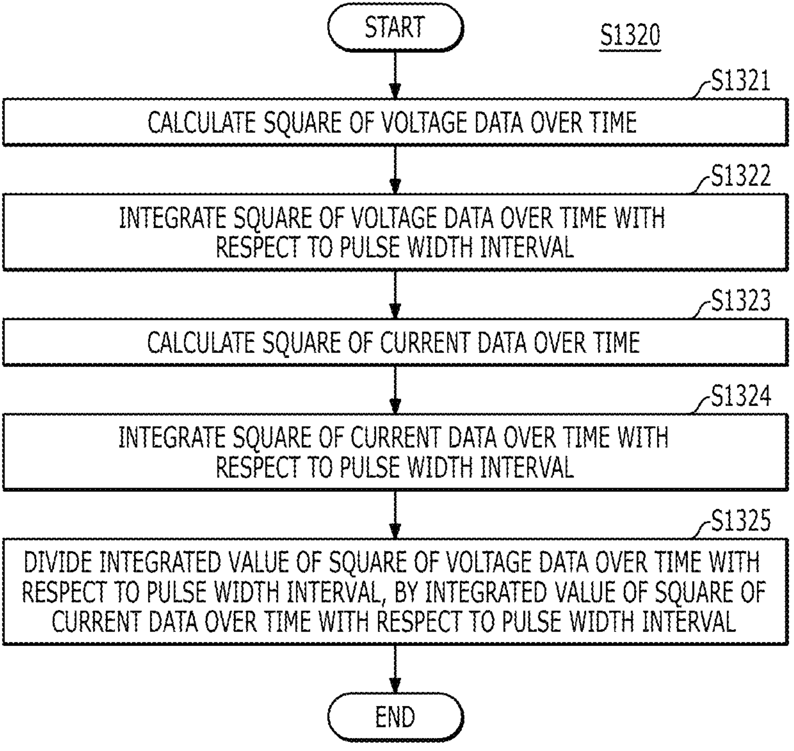
Figure 7:
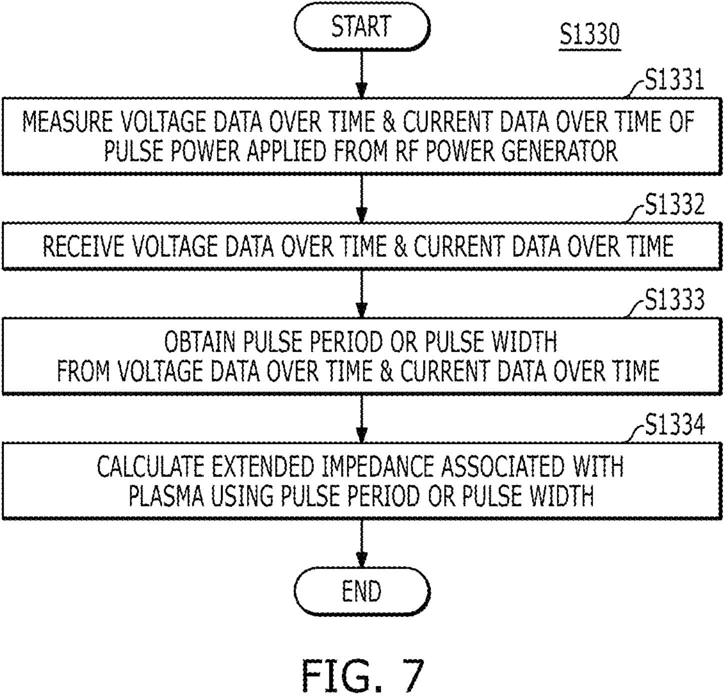
FIG. 7 is a flowchart provided to explain a method for calculating an extended impedance using a pulse period or a pulse width.

FIG. 4 is a flowchart provided to explain a method S1000 for calculating the extended impedance s according to embodiments of the present inventive concept. FIGS. 5 and 6 are flowcharts provided to explain methods S1310 and S1320 for calculating a real part and an imaginary part of the extended impedance. FIG. 7 is a flowchart illustrating a method S1330 of calculating the extended impedance by using a pulse period or a pulse width.

Referring to FIG. 4, the method S1000 for calculating the extended impedance according to some aspects may include first to third operations S1100 to S1300.

It is to be noted that aspects may be implemented differently, and the order of performing a specific calculation may be different from the order described herein. For example, two operations described in succession may be performed substantially simultaneously, or may be performed in the reverse order. Further, after some of the operations of the method S1000 for calculating the extended impedance are repeated, another operation may proceed.

The method S1000 may be initiated by the operation S1100 of measuring the voltage data over time and the current data over time of the non-sinusoidal wave power applied from the RF power generator. For example, the measuring device may measure the voltage data over time and the current data over time of the pulse power that is applied from the RF power generator. The measuring device may measure the voltage data over time and the current data over time of pulse power that is applied from the RF power generator. In the case of pulse power supply, power of a specific frequency may be applied by a constant pulse width, and the next power may be applied by the pulse width after a pulse period.

The measuring device may transmit the measured data to the controller. In embodiments of the present inventive concept, the measuring device may transmit data measured for the time that is longer than the width of the pulse power to the controller. For example, the measuring device may transmit data measured for the time that is equal to or greater than the width of the pulse power and equal to or less than the pulse period of the pulse power to the controller. However, embodiments of the present inventive concept are not limited thereto, and the measuring device may measure data on pulse power for several pulse periods and transmit the data to the controller.

The controller may receive voltage data over time and current data over time S1200. The controller may receive data that is measured for the time that is equal to or greater than the width of the pulse power and equal to or less than the pulse period of the pulse power. The controller may receive the pulse power data for a longer time, and the controller may use only the pulse power data for a part of the time for the calculation. For example, the controller may extract, from the received data, only the data that is greater than or equal to the width of the pulse power and less than or equal to the pulse period of the pulse power, and may use the same.

The controller may calculate an extended impedance associated with the plasma based on the voltage data over time and the current data over time S1300. The controller may calculate the extended impedance further based on at least one of a pulse period or pulse width values of the pulse power among the data received from the measuring device. The extended impedance may have a single complex value representing non-sinusoidal wave power associated with a plurality of frequencies. Equations for calculating the extended impedance are as follows.

Referring to FIGS. 5 to 7, the extended impedance $Z_b$ is a complex number and may have a real part $Z_a$ and an imaginary part $Z_c$. Therefore, the extended impedance may be expressed as $Z_b=Z_a+iZ_c$.

The real part $Z_a$ of the extended impedance may be calculated by the following equation.

$$Z_a \equiv \frac{\int_0^{\tau} V(t)\cdot I(t)\,dt}{\int_0^{\tau} I(t)\cdot I(t)\,dt} \quad \langle\text{Equation 1}\rangle$$

In Equation 1, τ may represent the period of the pulse, and V(t) and I(t) may represent the voltage and current data over time that are measured by the measuring device. For the calculation of the extended impedance, the value integrated over the pulse period is used, and therefore, may represent the average response to the entire pulse. The real part of the extended impedance may be calculated based on the product of the voltage data over time and the current data over time, and the square of the current data over time.

Referring to FIG. 5, a method S1310 for calculating the real part $Z_a$ of the extended impedance according to embodiments of the present inventive concept may include first to sixth operations S1311 to S1316. Aspects may be implemented differently, and the order of performing a specific calculation may be different from the order described herein. For example, two operations described in succession may be performed substantially simultaneously, or may be performed in the reverse order. In addition, after several operations of the method for calculating are repeated, other operations may proceed.

To calculate the real part $Z_a$ of the extended impedance, a pulse period or a pulse width may be input S1311. In one example, the user may input at least one of the pulse period or the pulse width of the pulse power through the user interface. In this case, the controller may receive the pulse period or the pulse width through the user interface. For example, the controller may receive an input of a pulse period of about 100 μs or a pulse width of about 30 μs. In embodiments of the present inventive concept, the controller may calculate the pulse period or the pulse width based on the voltage data over time and the current data over time that is received from the measuring device.

The second and third operations S1312 and S1313 may correspond to a method for calculating a numerator term in the integral equation of Equation 1. The controller may calculate a product of the voltage data over time and the current data over time S1312. For example, the controller may multiply the voltage data over time of the pulse power by the current data over time.

The controller may integrate the product of the voltage data over time and the current data over time with respect to the pulse width interval S1313. However, embodiments of the present inventive concept are not limited thereto, and the controller may integrate with respect to a time interval that is greater than or equal to the pulse width and less than or equal to the pulse period. The pulse power source may apply power for the time of the pulse width, and might not apply power until the next pulse period starts. Therefore, it is possible to integrate with respect to the time interval equal to or greater than the pulse width value and equal to or less than the pulse period value. However, the second operation S1312 and the third operation S1313 may be performed as a single calculation step.

The fourth and fifth operations S1314 and S1315 may correspond to a method of calculating the denominator of Equation 1. The controller may calculate a square of the current data over time S1314. For example, the controller may square the current data over time of the pulse power. In addition, the controller may integrate the square of the current data over time with respect to the pulse width interval S1315. However, the fourth operation S1314 and the fifth operation S1315 may be performed as a single calculation step.

The controller may divide the integrated value of the product of the voltage data over time and the current data over time with respect to the pulse width interval, by the integrated value of the square of the current data over time with respect to the pulse width interval S1316. In other words, the controller may divide the value calculated in the second and third operations S1312 and S1313 by the value calculated in the fourth and fifth operations S1314 and S1315. However, the method S1310 for calculating the real part $Z_a$ of the extended impedance described herein according to embodiments of the present inventive concept is only an example, and may be calculated by various other methods.

Equation 1 for calculating the extended impedance may be transformed by Fourier Transform. Equation 2 is expressed by transforming Equation 1 including voltage data and current data in time domain into frequency domain.

⟨Equation 2⟩

$$Z_a \equiv \frac{\int_0^{\tau} \mathrm{V}(t)\cdot I(t)\,dt}{\int_0^{\tau} I(t)\cdot I(t)\,dt} = \frac{\sum_k \mathrm{Re}\left(\widetilde{V_k}\widetilde{I_k}^{\dagger}\right)}{\sum_k \mathrm{Re}\left(\widetilde{I_k}\widetilde{I_k}^{\dagger}\right)} =$$

$$\frac{\sum_k \mathrm{Re}\left(\frac{\widetilde{V_k}}{\widetilde{I_k}}\widetilde{I_k}\widetilde{I_k}^{\dagger}\right)}{\sum_k \mathrm{Re}\left(\widetilde{I_k}\widetilde{I_k}^{\dagger}\right)} = \frac{\sum_k \mathrm{Re}(\widetilde{Z_k})\left|\widetilde{I_k}\right|^2}{\sum_k \left|\widetilde{I_k}\right|^2} = \langle \mathrm{Re}(\tilde{Z})\rangle_{I^2}$$

Referring to Equation 2, Equation 1 may be expressed in the form of a series form, that is, a sum of terms in the frequency domain. k may denote frequencies corresponding to integer multiples of several frequencies in the frequency domain, and $\widetilde{V_k}$ and $\widetilde{I_k}$ may denote Fourier coefficients for k frequency values. $\widetilde{I_k}^{\dagger}$ may denote conjugated complex numbers of $\widetilde{I_k}$ Fourier coefficient. When calculated in this way, it can be confirmed that the real part $Z_a$ of the extended impedance is a weighted average $\langle \mathrm{Re}(\tilde{Z})\rangle_{I^2}$ of the real part $\mathrm{Re}(\widetilde{Z_k})$ of the impedance calculated in the frequency domain of the non-sinusoidal wave power for the square of the current component.

⟨Equation 3⟩

$$Z_b^2 \equiv \frac{\int_0^{\tau} \mathrm{V}(t)\cdot \mathrm{V}(t)\,dt}{\int_0^{\tau} I(t)\cdot I(t)\,dt} = \frac{\sum_k \mathrm{Re}\left(\widetilde{V_k}\widetilde{V_k}^{\dagger}\right)}{\sum_k \mathrm{Re}\left(\widetilde{I_k}\widetilde{I_k}^{\dagger}\right)} =$$

$$\frac{\sum_k \mathrm{Re}\left(\frac{\widetilde{V_k}\widetilde{V_k}}{\widetilde{I_k}\widetilde{I_k}}\widetilde{I_k}\widetilde{I_k}^{\dagger}\right)}{\sum_k \mathrm{Re}\left(\widetilde{I_k}\widetilde{I_k}^{\dagger}\right)} = \frac{\sum_k |\widetilde{Z_k}|^2 |\widetilde{I_k}|^2}{\sum_k |\widetilde{I_k}|^2} = \langle |\tilde{Z}|^2 \rangle_{I^2} \approx \langle |\tilde{Z}| \rangle_{I^2}^2$$

Referring to Equation 3, the square $$Z_b^2$$

of the extended impedance may be calculated based on the square of voltage data over time and the square of current data over time. As in Equation 2, it may be seen that the square $$Z_b^2$$

of the extended impedance is a weighted average $$\langle |\tilde{Z}| \rangle_{I^2}^2$$

of the square of the impedance $\tilde{Z}$ calculated in the frequency domain of the non-sinusoidal wave power with respect to the square of the current component. In addition, the extended impedance $Z_b$ may be a weighted average $\langle |\tilde{Z}| \rangle_{I^2}$ of the impedance $\tilde{Z}$ calculated in the frequency domain of the non-sinusoidal wave power with respect to the square of the current component. t. In this case, to approximate the square of the mean to the average of the square, the variance of $\tilde{Z}_k$ must be smaller than the absolute value of $\tilde{Z}_k$, and thus the impedance distribution in the frequency domain may have to be concentrated in a specific frequency domain as shown in FIG. 7.

Referring to FIG. 6, a method S1320 for calculating the extended impedance $Z_b$, according to embodiments of the present inventive concept, may include first to fifth operations S1321 to S1325. It is to be noted that aspects may be implemented differently, and the order of performing a specific calculation may be different from the order described herein. For example, two operations described in succession may be performed substantially simultaneously, or may be performed in the reverse order. In addition, after several operations of the method for calculating are repeated, other operations may proceed.

To calculate the extended impedance $Z_b$, a pulse period or a pulse width may be input (e.g., S1311). The user may input at least one of a pulse period and a pulse width of the pulse power through the user interface. In addition, the controller may receive a pulse period or a pulse width through a user interface. For example, the controller may receive an input of a pulse period of about 100 μs or a pulse width of about 30 μs. In embodiments of the present inventive concept, the controller may calculate the pulse period or the pulse width based on the voltage data over time and the current data over time that is received from the measuring device.

The first and second operations S1321 and S1322 may be a method for calculating a numerator term in the integral equation of Equation 3. The controller may calculate a square of the voltage data over time S1321. For example, the controller may square the voltage data over time of the pulse power.

The controller may integrate the square of the voltage data over time with respect to the pulse width interval S1322. However, embodiments of the present inventive concept are not limited thereto, and the controller may integrate with respect to a time interval that is greater than or equal to the pulse width and less than or equal to the pulse period. The pulse power source may apply power for the time of the pulse width, and might not apply power until the next pulse period starts. Therefore, it is possible to integrate with respect to the time interval that is equal to or greater than the pulse width value and equal to or less than the pulse period value. However, the first operation S1321 and the second operation S1322 may be performed as a single calculation step.

The third and fourth operations S1323 and S1324 may correspond to a method for calculating the denominator of Equation 3. The controller may calculate a square of the current data over time S1323. For example, the controller may square the current data over time of the pulse power. In addition, the controller may integrate the square of the current data over time with respect to the pulse width interval S1324. However, the third and fourth operations S1323 and S1324 may be performed as a single calculation step.

The controller may divide the integrated value of the square of the voltage data over time with respect to the pulse width interval, by the integrated value of the square of the current data over time with respect to the pulse width interval S1326. In other words, the controller may divide the value calculated in the first and second operations S1321 and S1322 by the value calculated in the third and fourth operations S1323 and S1324. However, the method S1320 for calculating the extended impedance $Z_b$ according to embodiments of the present inventive concept is only an example, and may be calculated by various other methods.

⟨Equation 4⟩

$$\langle \mathrm{Im}(\tilde{Z})\rangle_{I^2}^2 \approx \langle \mathrm{Im}(\tilde{Z})^2\rangle_{I^2} = \frac{\sum_k \mathrm{Im}(\tilde{Z}_k)^2|\tilde{I}_k|^2}{\sum_k |\tilde{I}_k|^2} = \frac{\sum_k \left(|\tilde{Z}_k|^2 - \mathrm{Re}(\tilde{Z}_k)^2\right)|\tilde{I}_k|^2}{\sum_k |\tilde{I}_k|^2} = \left\langle |\tilde{Z}|^2\right\rangle_{I^2} - \left\langle \mathrm{Re}(\tilde{Z})^2\right\rangle_{I^2} \approx Z_b^2 - Z_a^2 \equiv Z_c^2$$

Referring to Equations 3 and 4, the imaginary part $Z_c$ of the extended impedance may be associated with the real part $Z_a$ of the extended impedance and the weighted average $$Z_b^2 = \frac{\sum_k |\tilde{Z}_k|^2|\tilde{I}_k|^2}{\sum_k |\tilde{I}_k|^2}$$

of the impedance calculated in the frequency domain of the non-sinusoidal wave power for the square of the current component.

The weighted average $\langle \mathrm{Im}(\tilde{Z})^2\rangle_{I^2}$ of the square of the imaginary part $\mathrm{Im}(\tilde{Z})$ of the impedance calculated in the frequency domain of the non-sinusoidal wave power with respect to the square of the current component may be the weighted average $\langle |\tilde{Z}|^2\rangle_{I^2}$ of the square $\langle |\tilde{Z}|^2\rangle_{I^2}$ of the impedance calculated in the frequency domain of the non-sinusoidal wave power minus with respect to the square of the current component the weighted average $\langle \mathrm{Re}(\tilde{Z})^2\rangle_{I^2}$ of the square $\mathrm{Re}(\tilde{Z})^2$ of the real part of the impedance calculated in the frequency domain of the non-sinusoidal wave power with respect to the square of the current component.

In addition, the imaginary part $Z_c$ of the extended impedance may be calculated based on the extended impedance and the real part ($Z_a$, $Z_b$) of the extended impedance. The square $$Z_c^2$$

of the imaginary part of the extended impedance may be calculated by subtracting the square $$Z_a^2)$$

of the real part of the extended impedance from the square $$Z_b^2)$$

of the extended impedance.

As such, without requiring a separate weight to be set, the method for calculating the extended impedance according to embodiments of the present inventive concept is capable of calculating a representative impedance of the non-sinusoidal wave power only with the voltage and current data over time applied from RF power. In addition, the method for calculating the extended impedance according to embodiments of the present inventive concept may be applicable not only to the plasma generated by the non-sinusoidal wave power, but also to the impedance of various loads to which non-sinusoidal wave power is applied.

Hereinafter, the impedance and the extended impedance in the frequency domain of the non-sinusoidal wave power will be described by using the voltage and current data over time that are measured by the measuring device and the method for calculating that is described above.

Figure 8:
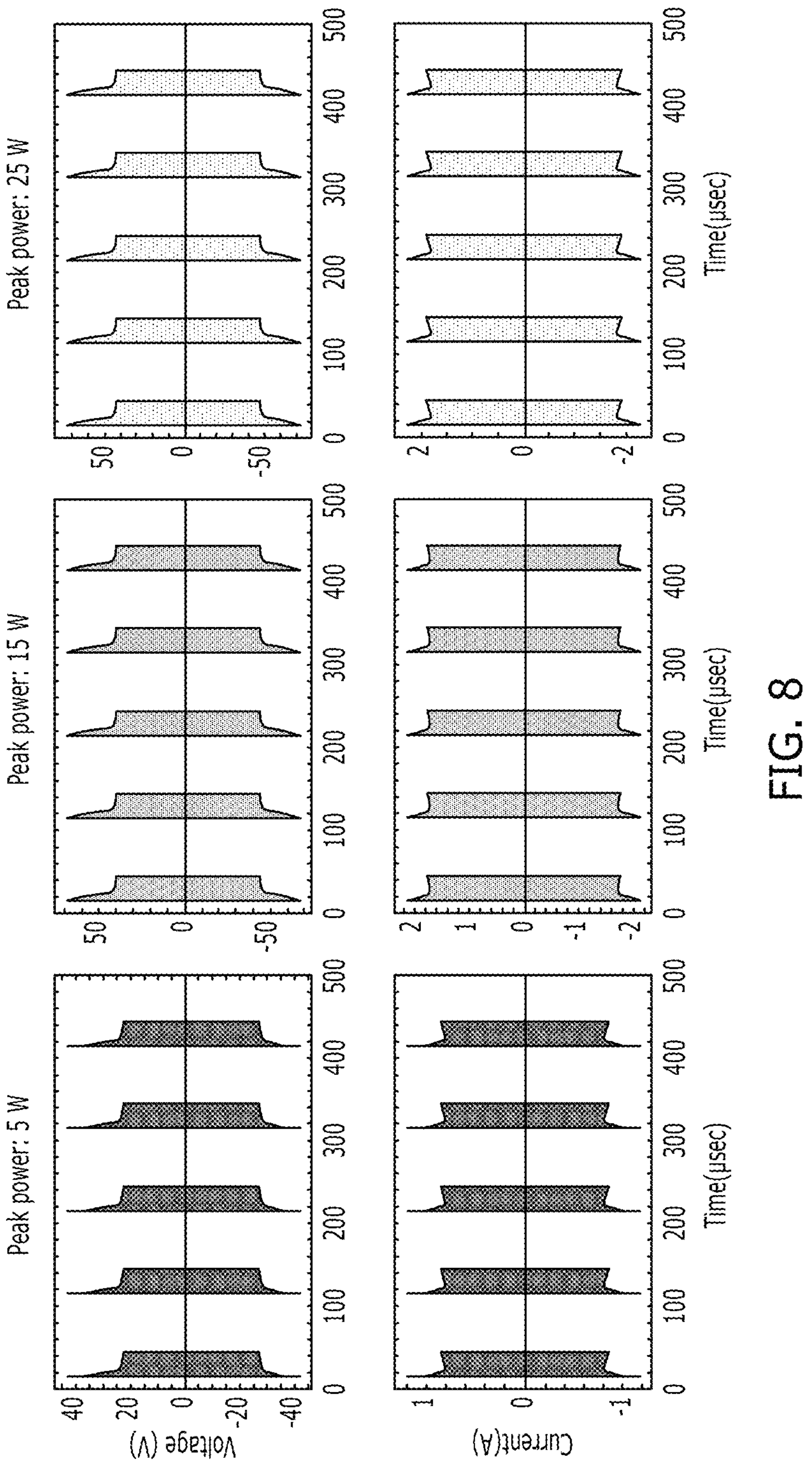
FIG. 8 is a graph illustrating voltage and current data over time of non-sinusoidal wave power according to a magnitude of applied power.
Figure 9:
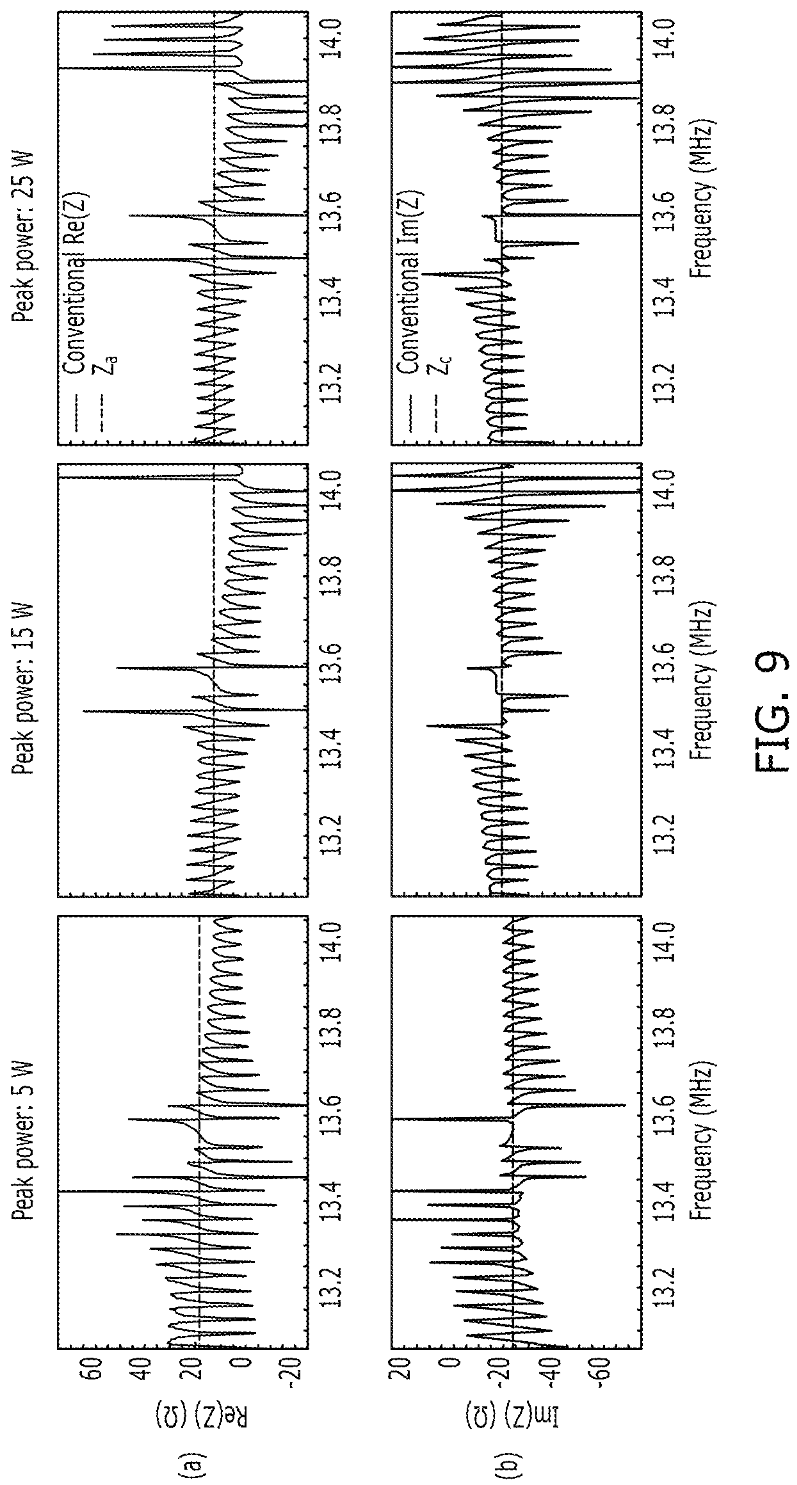
FIG. 9 is a graph illustrating a measured impedance and a calculated extended impedance in a frequency domain according to a magnitude of applied power.
Figure 10:
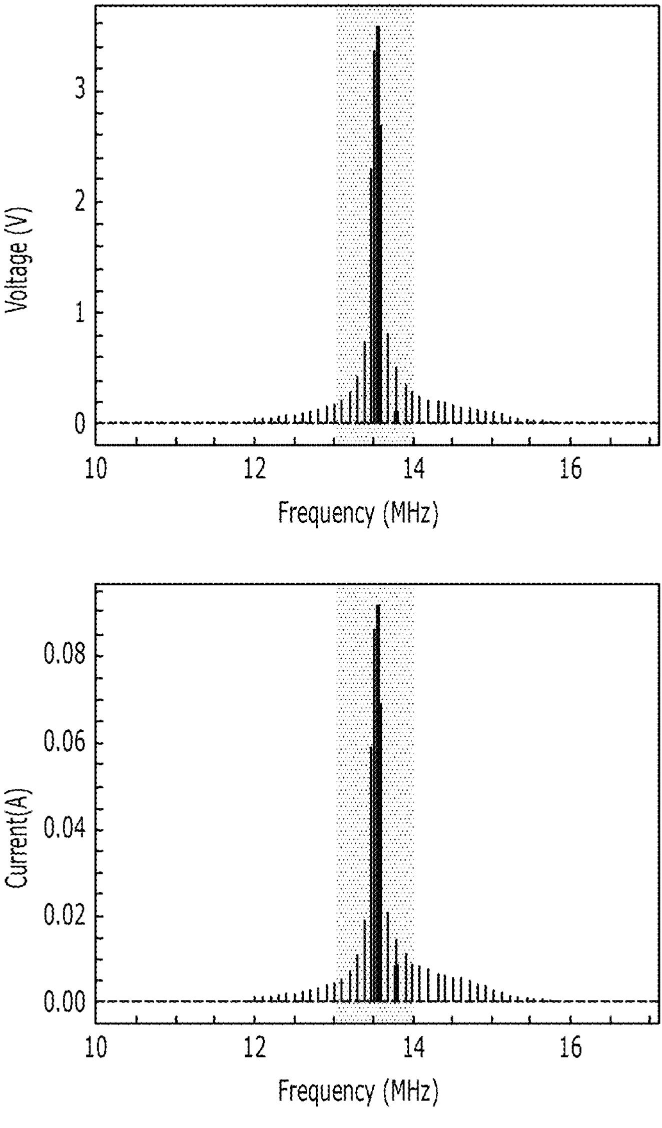
FIG. 10 is a graph illustrating an impedance in a frequency domain of non-sinusoidal wave power.
Figure 11:
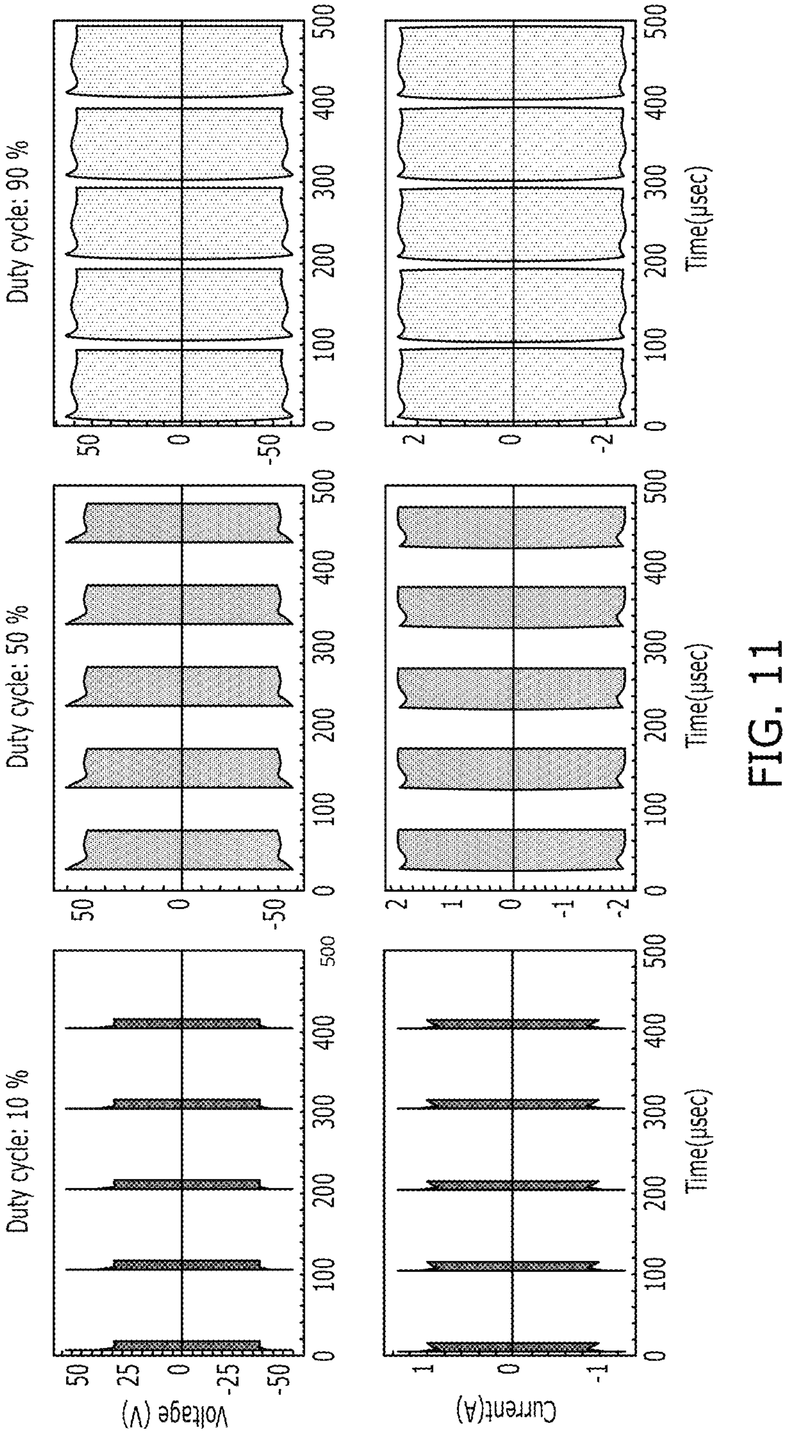
FIG. 11 is a graph illustrating voltage and current data over time of non-sinusoidal wave power according to a duty cycle.
Figure 12:
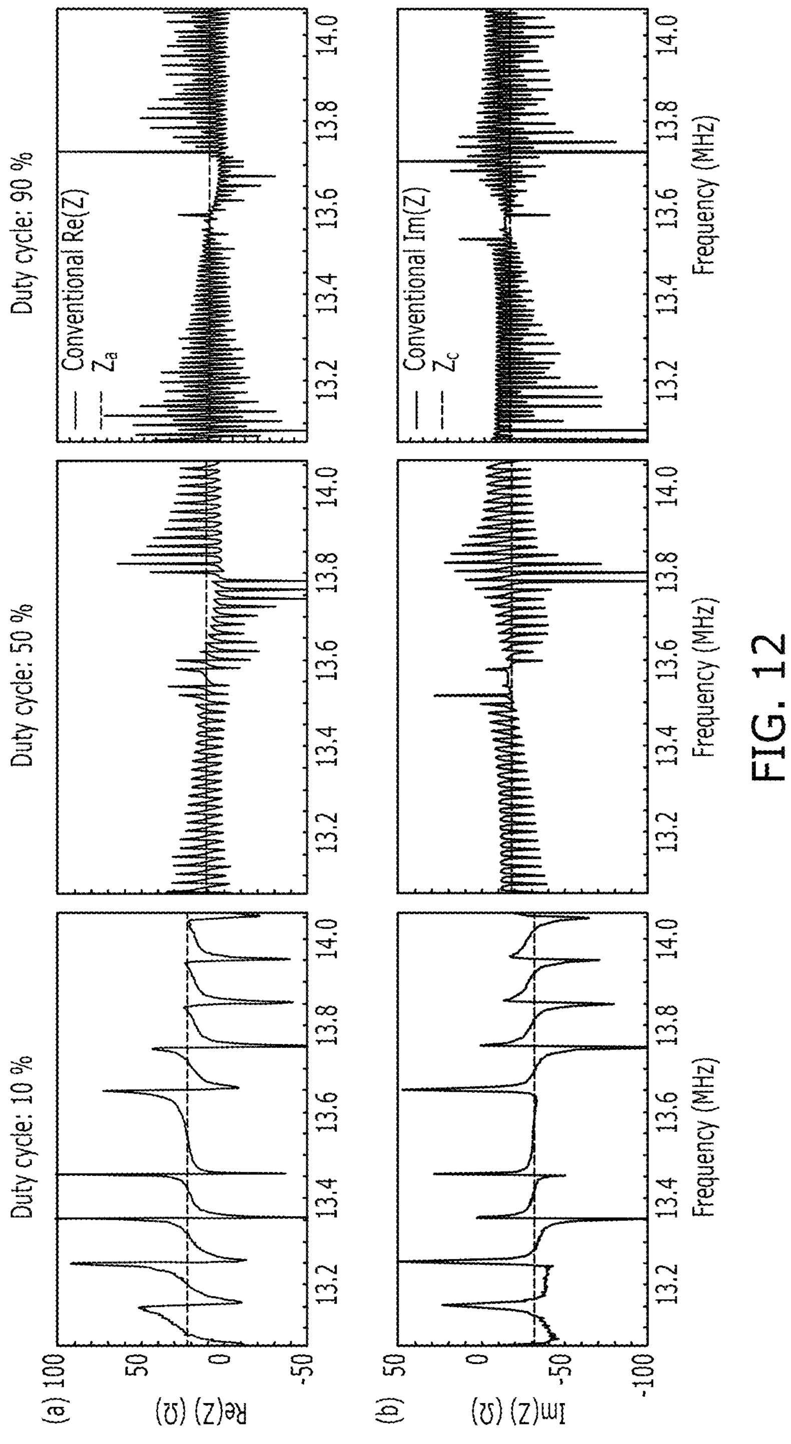
FIG. 12 is a graph illustrating a measured impedance and a calculated extended impedance in a frequency domain according to a duty cycle.

FIG. 8 is a graph illustrating voltage and current data over time of non-sinusoidal wave power according to a magnitude of applied power. FIG. 9 is a graph illustrating a measured impedance and a calculated extended impedance in a frequency domain according to a magnitude of applied power. FIG. 10 is a graph illustrating impedance in a frequency domain of non-sinusoidal wave power. FIG. 11 is a graph illustrating voltage and current data over time of non-sinusoidal wave power according to a duty cycle. FIG. 12 is a graph illustrating a measured impedance and a calculated extended impedance in a frequency domain according to a duty cycle.

Referring to FIG. 8 to FIG. 12, the controller may calculate the extended impedance based on the voltage and current data over time that are obtained from the non-sinusoidal wave power.

For the calculation of the extended impedance, an RF pulse signal with a driving frequency of 13.56 MHz, a pulse width of 10 to 90 μs, and a pulse period of 100 μs may be generated in a signal generator, amplified by an RF amplifier, thereby creating plasma between the upper and lower electrodes in the chamber. Argon (Ar) set to an atmosphere of about 150 m Torr may be supplied into the chamber as the process gas.

Referring to FIG. 8, the voltage data over time and the current data over time are obtained while changing the peak power of the non-sinusoidal wave to 5 W, 15 W, and 25 W. In this case, a pulse width of the non-sinusoidal wave may be 30 μs, and a pulse period may be 100 μs. That is, the duty cycle of the non-sinusoidal wave may be 30%.

Referring to FIG. 9, the impedance of the non-sinusoidal wave power and the calculated extended impedance are shown, respectively. The x-axis may represent a frequency domain (MHz), and y-axis may represent a magnitude of impedance. The impedance of the non-sinusoidal wave power is shown by a solid line, and the calculated extended impedance is shown by a dotted line. FIG. 9 (*a*) shows a real part of the complex impedance, and FIG. 9 (*b*) shows an imaginary part of the complex impedance.

An extended impedance value may be calculated from the voltage data over time and the current data over time in FIG. 8. According to the equations described above, the real part and the imaginary part of the extended impedance may be calculated, respectively. The real and imaginary parts of the calculated extended impedance are shown by dotted lines in FIG. 9 (*a*) and FIG. 9 (*b*), respectively.

The voltage data over time and the current data over time of the non-sinusoidal wave power may be transformed and represented by Fourier Transform. For example, FIG. 10 illustrates data with a peak power of 15 W in FIG. 8 in the frequency domain. Referring to FIG. 10, x-axis may represent a frequency, and y-axis may represent a magnitude of a current or voltage. It can be seen that a large magnitude of voltage and current appears in the frequency domain near about 13.56 MHz which is the driving frequency used by the signal generator of the RF power generator. That is, it can be seen that the voltage and current data according to the frequency of FIG. 10 have smaller variance than the absolute values of the voltage and the current. Specifically, FIG. 9 shows the driving frequency of 13.56 MHz in the range of 0.5 MHz, that is, in the range from 13.06 MHz to 14.06 MHz.

As shown in FIG. 9, it can be seen that, as the peak power increases, the absolute magnitude of the real part and the imaginary part of the impedance calculated in the frequency domain decreases, and the absolute magnitude of the extended impedance also decreases.

FIG. 12 is a diagram illustrating the impedance and the extended impedance of the non-sinusoidal wave power in a frequency domain calculated based on the voltage data and the current data over time as measured by the measuring device shown in FIG. 11. Referring to FIGS. 11 and 12, voltage data over time and current data over time may be obtained while changing the duty cycle to 10%, 50%, and 90%. In this case, the peak power may be 15 W, and the pulse period may be 100 μs. As shown in FIG. 10, FIG. 12 illustrates from 13.06 MHz to 14.06 MHz based on the driving frequency of the RF power generator, which is 13.56 MHz.

As shown in FIG. 12, as the duty cycle increases, the absolute magnitudes of the real and imaginary parts of the impedance calculated in the frequency domain decrease, and the absolute magnitudes of the extended impedance also decrease. In addition, it can be seen that the real and imaginary parts of the extended impedance have similar values in the two cases of 50% and 90% duty cycles with different spectral widths of the impedance calculated in the frequency domain. Accordingly, it can be seen that the extended impedance is affected by the magnitude of the impedance and not by the spectral width of the impedance.

As shown in FIGS. 9 and 12, the impedance calculated in the frequency domain of the non-sinusoidal wave power applied from the RF power generator may vary depending on the frequency. In addition, the real part and the imaginary part of the extended impedance may have a constant value even if the frequency value is changed. The extended impedance may represent one complex number value even if the frequency value is changed. That is, the extended impedance may have a single complex value representing non-sinusoidal wave power associated with a plurality of frequencies. As described above, the extended impedance representing the non-sinusoidal wave power may be calculated from the voltage data over time and the current data over time that are obtained from the non-sinusoidal wave power. Accordingly, the extended impedance may be used as a representative value of power excluding dependence on the frequency with respect to the non-sinusoidal wave power including composite frequencies.

Figure 13:
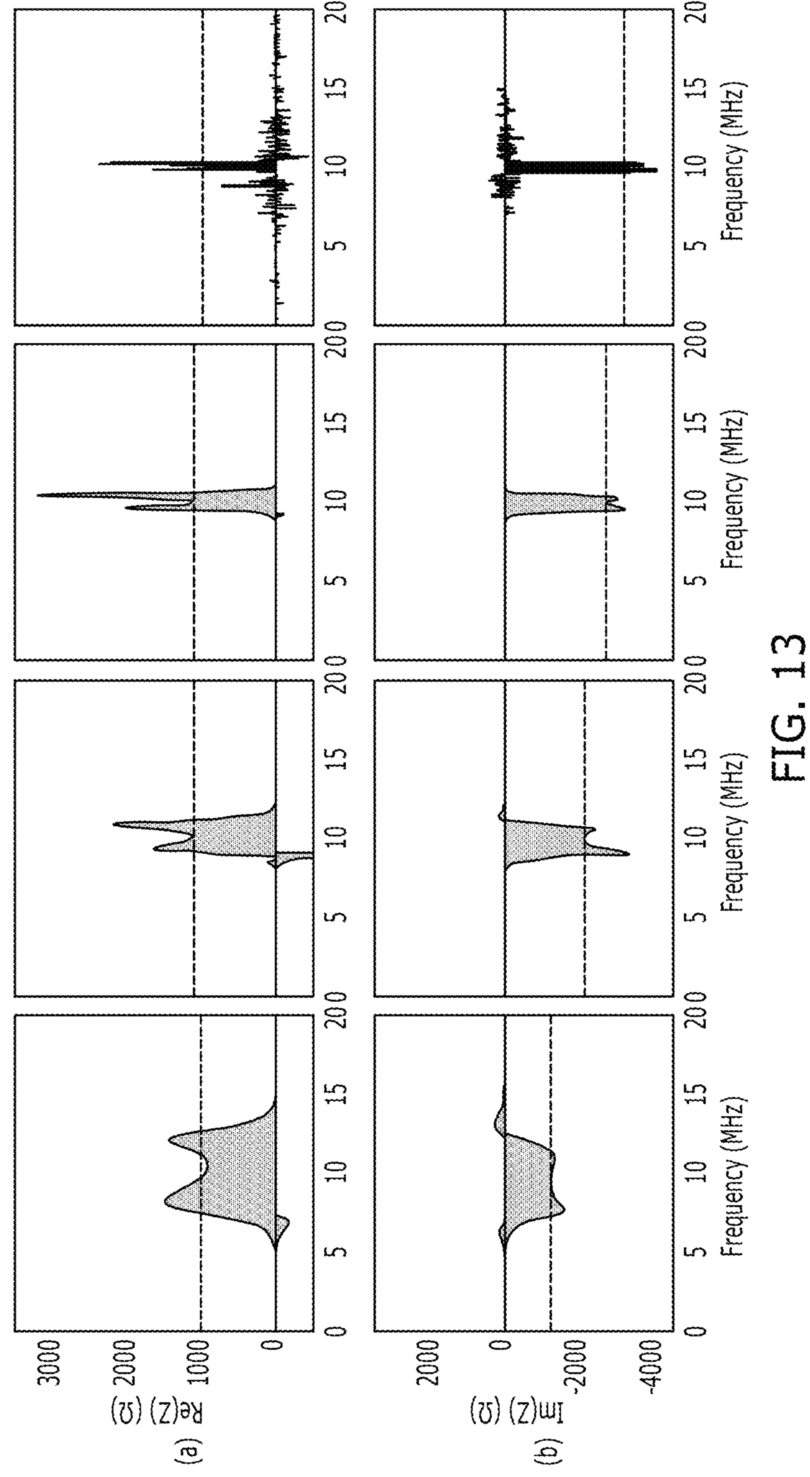
FIG. 13 is a graph illustrating a change in the extended impedance according to a pulse period.

FIG. 13 is a graph illustrating a change in extended impedance according to a pulse period.

Referring to FIG. 13, it may be seen that the extended impedance is independent of the frequency width and varies in proportion to the magnitude of the impedance. For example, the extended impedance may be independent of the frequency and represent non-sinusoidal wave power associated with a plurality of frequencies. The width of the frequency may vary according to the pulse period. For example, if the pulse period increases, the width in the frequency domain decreases, and if the pulse period decreases, the width of the frequency may increase.

In FIG. 13, it may be seen that, as the pulse period increases by 2 times, 5 times, 10 times, and 20 times, the width of the real part and the imaginary part of the impedance each calculated in the frequency domain decrease in the frequency domain. Specifically, in FIG. 13 (*a*), it can be seen that the width of the real part of the impedance of the non-sinusoidal wave power in the frequency domain decreases as the pulse period increases.

In addition, the magnitude of the real part of the impedance of the non-sinusoidal wave power might not significantly change even when the pulse period is increased. Like the real part of the impedance of the non-sinusoidal wave power, even if the pulse period increases, the real part of the extended impedance might not show a significant change. In addition, it can be seen that the real part of the extended impedance and the real part of the impedance of the non-sinusoidal wave power have substantially the same value near the driving frequency (e.g., about 10 MHz).

The imaginary part value of the impedance of the non-sinusoidal wave power may decrease as the pulse period increases, and the imaginary part of the extended impedance may also decrease as the pulse period increases. It may be seen that the imaginary part of the extended impedance and the imaginary part of the impedance of the non-sinusoidal wave power have substantially the same value near the driving frequency (e.g., about 10 MHz).

As such, it can be seen that the extended impedance changes with the same tendency as a change in the magnitude of the impedance of the non-sinusoidal wave power and has a constant value regardless of the change in the frequency value due to the change in the pulse period. For example, the extended impedance may reflect the magnitude of the impedance generated by the non-sinusoidal wave power and has a value that is independent of the frequency domain.

Figure 14:
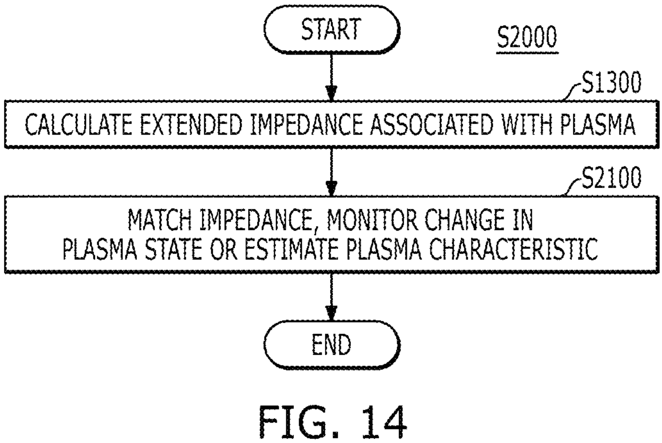
FIG. 14 is a flowchart provided to explain a method for controlling a plasma apparatus using an extended impedance, according to embodiments of the present inventive concept.

FIG. 14 is a flowchart provided to explain a method S2000 for controlling a plasma apparatus using an extended impedance, according to embodiments of the present inventive concept.

The method S2000 may be initiated by the controller calculating (S1300) the extended impedance based on the voltage data over time and the current data over time of the non-sinusoidal wave power that is received from the measuring device.

The plasma apparatus according to embodiments of the present inventive concept may be controlled based on the extended impedance. For example, the controller may match impedance, monitor a change in the state of the plasma, or estimate characteristics of the plasma based on the extended impedance S2100.

In embodiments of the present inventive concept, the controller may control the matching circuit based on the extended impedance. The matching circuit may be provided for maximizing transfer of non-sinusoidal wave power. If the impedance of the extended impedance and the impedance of the non-sinusoidal wave power do not match, the matching circuit may match the impedance. If the extended impedance and the impedance of the non-sinusoidal wave power do not match, it may mean that there is a loss in power that is applied from the RF power generator to the chamber. Therefore, the matching circuit may match the extended impedance with the impedance of the non-sinusoidal wave power to maximize the transfer of the non-sinusoidal wave power.

In embodiments of the present inventive concept, the controller may control the matching circuit such that the extended impedance value becomes a predetermined complex number value. For example, if the complex impedance is matched to 5052, the reflected power may be minimized, that is, the transfer of the non-sinusoidal wave power may be maximized. That is, the controller may control the matching circuit such that the plasma impedance in the chamber and the impedance of the RF power generator match at 502.

In embodiments of the present inventive concept, the controller may control the RF power supply such that the impedance of the non-sinusoidal wave power is equal to the extended impedance. The controller may transmit a feedback signal to the RF power generator. In addition, the controller may transmit a feedback signal to the RF power generator through the matching circuit. The RF power generator may apply power having the same impedance as the impedance of the plasma by feedback control.

In embodiments of the present inventive concept, the controller may control the matching circuit such that the imaginary part of the extended impedance becomes 0. As the imaginary part of the plasma impedance approaches 0, matching performance of the matching circuit may increase. Accordingly, the controller may control the matching circuit or RF power generator so that the imaginary part of the extended impedance approaches 0.

The controller may monitor a change in the state of the plasma based on the extended impedance. The state of the plasma may vary depending on the geometry and parameters of the plasma. For example, in the etching process using plasma, silicon particles may penetrate the plasma as the substrate is etched, affecting the electron density of the plasma, and further affecting the process result. However, this is merely an example and embodiments of the present inventive concept are not limited thereto. As described above, in the plasma apparatus according to embodiments of the present inventive concept, the controller may monitor the electron density of the plasma based on the extended impedance of the plasma to detect the end point of the process, or monitor the process conditions, progress of the process, etc.

The controller may estimate the characteristics of the plasma based on the extended impedance. For example, the controller may measure the density of the plasma based on the extended impedance. However, this is merely an example and aspects are not limited thereto. If the density of the plasma increases, the impedance of the plasma may decrease, and if the density of the plasma decreases, the impedance of the plasma may increase. In addition, the density of plasma may change with the applied voltage and power. Therefore, it is possible to estimate the state of voltage and power that are applied to the chamber from the impedance of the plasma and from the characteristics of the plasma.

While the present inventive concept has been described with reference to embodiments thereof, it will be understood by those of ordinary skill in the art that various changes in form and details may be made thereto without departing from the spirit and scope of the present inventive concept.

What is claimed is:

1. A plasma apparatus comprising:

a chamber;

a first electrode and a second electrode disposed in the chamber, wherein the second electrode is spaced apart from the first electrode;

an RF power generator configured to apply non-sinusoidal wave power to the first electrode, wherein plasma is generated in the chamber in response to the non-sinusoidal wave power being applied to the first electrode;

a measuring device configured to measure a voltage data over time and a current data over time of the non-sinusoidal wave power that is applied from the RF power generator; and a controller configured to receive the voltage data over time and the current data over time from the measuring device, and to calculate an extended impedance associated with the plasma based on the voltage data over time and the current data over time, wherein the extended impedance has a single complex value representing the non-sinusoidal wave power associated with a plurality of frequencies.

2. The plasma apparatus according to claim 1, wherein the extended impedance is a weighted average of an impedance calculated in a frequency domain of the non-sinusoidal wave power with respect to a square of a current component.

3. The plasma apparatus according to claim 2, wherein the impedance calculated in the frequency domain of the non-sinusoidal wave power varies according to frequency, and the extended impedance of the non-sinusoidal wave power has a single complex value independent of the frequency.

4. The plasma apparatus according to claim 1, wherein a real part of the extended impedance is a weighted average of a real part of an impedance calculated in a frequency domain of the non-sinusoidal wave power with respect to a square of a current component.

5. The plasma apparatus according to claim 4, wherein an imaginary part of the extended impedance is associated with the real part of the extended impedance and a weighted average of a square of the impedance calculated in the frequency domain of the non-sinusoidal wave power with respect to the square of the current component.

6. The plasma apparatus according to claim 1, wherein the controller is configured to calculate a real part of the extended impedance based on a product of the voltage data over time and the current data over time, and a square of the current data over time.

7. The plasma apparatus according to claim 6, wherein the controller is configured to calculate an imaginary part of the extended impedance based on the square of the voltage data over time, a square of the current data over time, and the real part of the extended impedance.

8. The plasma apparatus according to claim 1, wherein the non-sinusoidal wave power is pulse power.

9. The plasma apparatus according to claim 8, wherein the controller is configured to calculate the extended impedance based on at least one of a pulse period value or a pulse width value of the pulse power.

10. The plasma apparatus according to claim 8, wherein the voltage data over time is data measured for a time equal to or greater than a pulse width of the pulse power and equal to or less than a pulse period of the pulse power, and the current data over time is data measured for a time equal to or greater than the pulse width of the pulse power and equal to or less than a pulse period of the pulse power.

11. The plasma apparatus according to claim 1, further comprising a matching circuit connected between the RF power generator and the measuring device to adjust impedance for transferring the non-sinusoidal wave power, wherein the controller is configured to control the matching circuit based on the calculated extended impedance.

12. The plasma apparatus according to claim 11, wherein the controller is configured to control the matching circuit so that the extended impedance becomes a predetermined complex number value.

13. The plasma apparatus according to claim 11, wherein the controller is configured to control the matching circuit so that an imaginary part of the extended impedance becomes 0.

14. The plasma apparatus according to claim 11, wherein the measuring device is connected between the matching circuit and the first electrode.

15. The plasma apparatus according to claim 1, wherein the measuring device is disposed outside the chamber.

16. The plasma apparatus according to claim 1, wherein the controller is configured to monitor a change in a state of the plasma in the chamber based on the calculated extended impedance.

17. The plasma apparatus according to claim 1, wherein the controller is configured to estimate a characteristic of the plasma that is in the chamber based on the calculated extended impedance.

18. A plasma apparatus comprising:

a chamber;

a first electrode a second electrode disposed in the chamber, the second electrode facing the first electrode;

an RF power generator configured to apply non-sinusoidal wave power to the first electrode, wherein plasma is generated in the chamber in response to the non-sinusoidal wave power being applied to the first electrode;

a measuring device disposed outside the chamber and configured to measure a voltage data over time and a current data over time of non-sinusoidal wave power that is applied from the RF power generator; and a controller configured to receive the voltage data over time and the current data over time from the measuring device, and calculate an extended impedance associated with the plasma based on the voltage data over time and the current data over time, wherein impedance calculated in a frequency domain of the non-sinusoidal wave power varies according to frequency, and the extended impedance has a single complex number value independent of the frequency, and is a weighted average of the impedance calculated in the frequency domain of the non-sinusoidal wave power with respect to a square of a current component.

19. The plasma apparatus according to claim 18, further comprising a matching circuit connected between the RF power generator and the measuring device for transferring the non-sinusoidal wave power, wherein the controller is configured to calculate a real part and an imaginary part of the extended impedance based on the voltage data over time and the current data over time, and control the RF power generator so that the impedance of the non-sinusoidal wave power is equal to the extended impedance.

20. A plasma apparatus comprising:

a vacuum chamber provided with an upper electrode, to which power is applied, and a grounded lower electrode;

an RF power generator configured to apply pulse power to the upper electrode, wherein plasma is generated between the upper electrode and the grounded lower electrode in response to the pulse power being applied to the upper electrode;

a measuring device disposed outside the vacuum chamber and configured to measure voltage data over time, current data over time, and a pulse period value of the pulse power that is applied from the RF power generator;

a matching circuit connected between the RF power generator and the measuring device to adjust impedance for transferring the pulse power; and a controller configured to:

receive the voltage data over time, the current data over time, and the pulse period value, calculate an extended impedance associated with the plasma based on the voltage data over time, and the current data over time, and control the matching circuit based on the extended impedance, wherein an impedance calculated in a frequency domain of the pulse power varies with frequency, and the extended impedance has a single complex value that is independent of the frequency and represents the pulse power associated with a plurality of frequencies.

* * * * *